United States Patent [19]

Lonergan et al.

[11] Patent Number: 5,775,418

[45] Date of Patent: Jul. 7, 1998

[54] T-SHAPED LOCKING MEMBER FOR ENGAGING A PASSAGEWAY IN A HEAT SINK FOR SECUREMENT TO A MOUNTING BOARD

[75] Inventors: Kevin Lonergan, Monument; Karl Cunha; John Kosatschkow, both of Colorado Springs; Ralph Michael Tusler, Monument, all of Colo.

[73] Assignee: Digital Equipment Corporation, Maynard, Mass.

[21] Appl. No.: 717,338

[22] Filed: Sep. 20, 1996

[51] Int. Cl.⁶ ..................................................... F28F 7/00
[52] U.S. Cl. ........................ 165/80.2; 174/138 G; 361/710; 248/223.41; 248/80.3
[58] Field of Search .................. 174/138 G, 138 D; 257/706, 707; 165/80.3, 80.2, 185; 248/223.41; 361/704, 709, 710, 711, 712, 713, 714, 715, 716, 717, 718, 719, 720, 722

[56] References Cited

U.S. PATENT DOCUMENTS

| | | | |
|---|---|---|---|
| 4,388,967 | 6/1983 | Breese | 165/80.3 |
| 4,970,761 | 11/1990 | Nakamura | 24/453 |
| 5,396,404 | 3/1995 | Murphy et al. | 361/719 |
| 5,422,789 | 6/1995 | Fisher et al. | 361/719 |
| 5,469,330 | 11/1995 | Karabatsos et al. | 361/704 |

Primary Examiner—Kristine L. Kincaid
Assistant Examiner—Kamand Cuneo
Attorney, Agent, or Firm—Gary Ross

[57] ABSTRACT

An arrangement for mounting a heat sink to a mounting board. The arrangement includes a heat sink and a locking member. The heat sink has a bottom surface and a passageway extending therein from an entrance opening on the bottom surface in a direction normal thereto and terminating with a closed end at its inner end. The passageway has an entrance region tapering toward the closed end and an inner region defined by generally parallel side wall portions. The side wall portions defining the entrance region including an engagement surface facing the closed end of the passageway. The locking member is T-shaped with the member crossing the stem of the T adapted for snug fit engagement with the generally parallel walls of the passageway's inner region. Moreover, the crossing member has an engagement member at each of it's ends that extend toward the base of the stem. The engagement members interlock with the engagement surface when the locking member is inserted into the passageway of the heat sink.

3 Claims, 3 Drawing Sheets

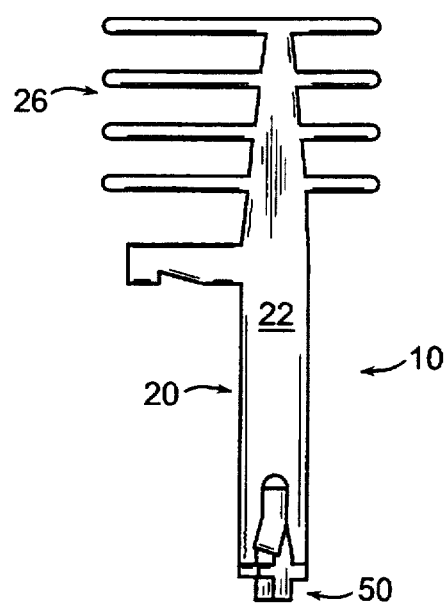
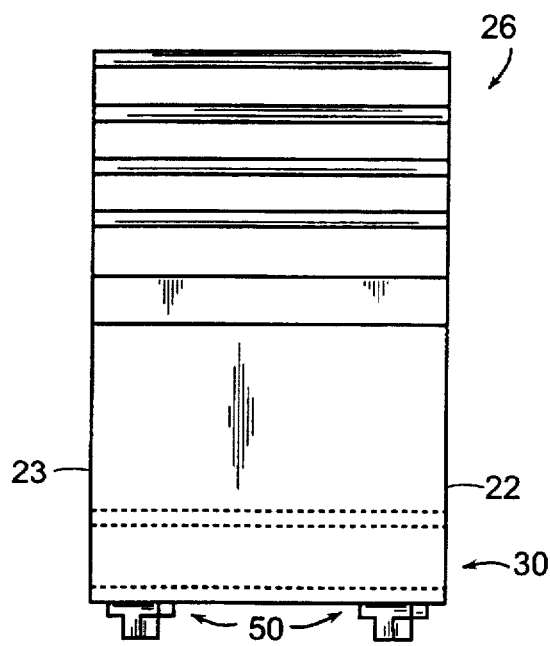
FIG. 1
FIG. 2
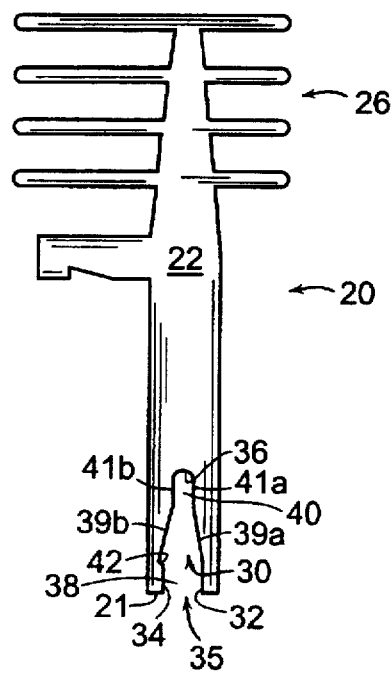
FIG. 3

T-SHAPED LOCKING MEMBER FOR ENGAGING A PASSAGEWAY IN A HEAT SINK FOR SECUREMENT TO A MOUNTING BOARD

FIELD OF THE INVENTION

This invention relates generally to securing two members together and more specifically, to mounting heatsinks to printed circuit boards.

BACKGROUND OF THE INVENTION

In electrical equipment such as computer systems various components such as power supplies require the use of heatsinks to dissipate the heat energy generated by the component. The heatsink is generally an extruded aluminum mass to absorb the heat and includes fins to transfer the heat energy to the air. Mounting of the heatsink to a printed circuit board (hereinafter board) generally involves physically securing the heatsink to the board by means of screws inserted from underneath the board into drilled and tapped holes in the heatsink. Of course, screw hole alignment is important as the screws must be inserted from beneath the board through holes in the board into the tapped holes in the heatsink on the other side of the board. Therefore, this method is somewhat costly. The use of self tapping screws eliminates the need and cost of tapping aligned screw holes, as the screws are inserted into a slot in the heatsink, but the cost of hand driving screws into the heatsink is still incurred. Another method known in the art includes the use of solderable PEM nuts, manufactured by Penn Engineering and Manufacturing Corp., Danboro, Pa. The use of PEM nuts eliminates the need of screws but does not eliminate the need to drill alignment holes into the heatsink.

All of the above mentioned systems are costly in that they involve significant hand labor or time including aligning of drill holes, tapping of the heat sink and, most significantly, driving the screws into the heat sink when it is mounted on the board. As the price of devices using such components is affected by the amount of hand labor time involved in the production process the elimination of a mounting system involving screws can be cost effective. In addition, driving self tapping screws into aluminum heatsinks can create aluminum fragments which may cause electrical shorts in the system and the elimination of this potential problem is important.

A mounting system or apparatus which eliminates the need to tap screw holes and eliminates the use of screws and the attendant high labor cost involved in assembling the heatsink to the board is of significant important to the industry. In addition, as is common in the industry, the heatsink is attached to the printed circuit board. A heatsink thus mounted will interfere with the circuit traces along the surface of the board and judicious location of the heatsink or the traces can be costly. Therefore, a heatsink mounting system which securely attaches the heatsink to the board and allows the circuit traces on the surface of the board to pass underneath the heatsink is desirable.

SUMMARY OF THE INVENTION

In a broad sense the present invention resides in a novel arrangement of two members so designed and dimensioned as to fit together in a locking arrangement which securely holds the members together. In this regard, one of the members includes a channel in one of its surfaces including two spaced apart side walls forming an inner and an outer region, for receipt of the second member, and a bottom. The outer region tapers toward the bottom and the inner region is located between the outer region and the bottom. An engagement surface facing the bottom of the channel is formed on one of the tapering walls. The other member is essentially designed and dimensioned to fit snugly into the channel and engage the engagement surface in like manner as a barb engages material when inserted into an object, thus preventing the removal of either member.

The second member is so designed and dimensioned as to fit snugly into the channel in the first member including the tapering side walls so as to prevent relative movement between the members. Further, the second member includes a resilient portion on one side which permits the second member to be inserted into the channel, deflect a certain amount as it enters the channel and then spring back as it enters the tapered outer region to lock the two members together as it engages the engagement surface.

Moreover, the second member has a stabilizing surface on the side opposite the resilient portion, so dimensioned as to fit snugly against the other side wall of the tapering outer region.

The second member further includes a base portion set at an angle offset from the direction of the channel in the first member to prevent rocking of the first member.

In one embodiment of the invention wherein the first member is embodied in a heatsink, the base portion of the second member also functions to hold the heatsink a set distance off the printed circuit board to allow traces to pass under the heatsink.

BRIEF DESCRIPTION OF THE DRAWINGS

The above and further advantages of the invention may be better understood by referring to the following description in conjunction with the accompanying drawings, in which:

FIG. 1 is a side elevation view of a computer power supply heatsink using an insertable locking member mounting arrangement according to the invention.

FIG. 2 is a front elevation view of the computer power supply heatsink of FIG.1.

FIG. 3 is a side elevation view of the computer power supply heatsink of FIG.1 without the insertable locking member.

DETAILED DESCRIPTION OF ILLUSTRATIVE EMBODIMENTS

Figure 4:
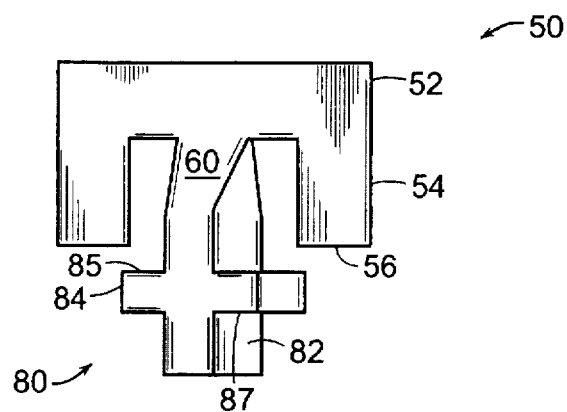
FIG. 4 is an enlarged front elevation view of the insertable locking member shown in FIG. 1 engaged with the heat sink.

FIG. 1 depicts the apparatus 10 of this invention, including a computer power supply heatsink 20 and an insertable locking member 50, showing the heatsink 20 having fins 26 and insertable locking member 50 securely attached to each other. FIGS.2 and 3 show further details of the secured heatsink 20. The power supply chip is not shown but is attached to the heatsink 20 in various ways as is well known in the art.

Referring to FIG.3, the heatsink 20 includes a channel 30 in one external surface 21, formed by any of a number ways known in the art such as during the extrusion of the heatsink 20, to accommodate the insertable locking member 50. In this embodiment shown in the figures, the external surface 21 is the bottom surface of the heatsink 20 which will be located in close spaced proximity to a printed circuit board when the heatsink 20 is mounted thereon. The channel 30 extends from one side 22 (see FIG.2) to the other side 23 (see FIG.2) of the heatsink and includes two spaced apart side walls 32, 34 and a bottom 36. The side walls 32 and 34 define an entrance 35, an outer region 38 of the channel 30 disposed near the external surface 21 and an inner region 40 disposed between the outer region 38 and the bottom 36. The outer region 38 includes side wall portions 39a and 39b, which initiate at the external surface 21 to define the entrance 35 and eventually taper toward the bottom 36 of the channel. In FIGS.1, 2 & 3, side walls 39a and 39b are generally parallel, to define the entrance 35 that is shown, for about ⅓ of the length of the outer region although no particular length is required for the purposes of this invention other than as required to provide support and stability for the size and weight of the structures involved. The side walls 39a and 39b then taper toward the bottom 36 of the channel.

In one side wall, 39b in the embodiment of the Figures, an engagement surface 42 is formed generally facing toward the bottom 36 of the channel. The engagement surface 42 is shown at the interface between the uniform and the tapering portions of the side wall 39b. The engagement surface 42 may be orthogonal to the axis defined by a line drawn from the external surface 21 and the bottom 36 or it may be at some angle less than 90 degrees.

The inner region 40 includes side walls 41a and 41b having a generally parallel orientation. Depending upon the manufacturing process involved in making the channel 30, the side walls 41a, 41b may connect to a generally flat or, as shown in FIG.3, an arcuate shaped bottom 36.

Figure 5:
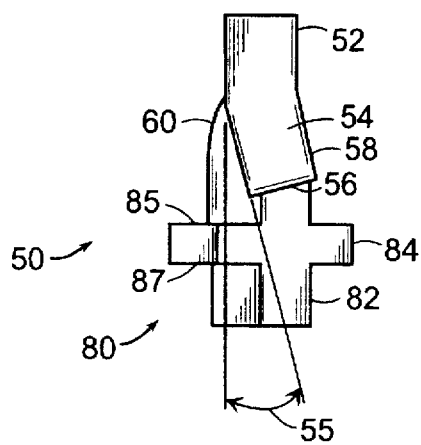
FIG. 5 is a side elevation of the locking member of FIG. 4.
Figure 6:
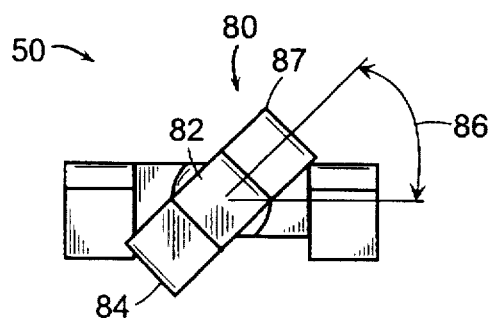
FIG. 6 is a bottom view of the locking member of FIG. 4.

Referring to FIGS. 4, 5 and 6 the one piece insertable locking member 50 includes a generally rectangular leading portion 52 on either side of the member 50 dimensioned and shaped for snug fit engagement with the side walls 41a, 41b of the inner region 40 of the channel 30. Contiguous with and depending from the leading portion 52 is a resilient locking portion 54. The resilient locking portion 54 is shaped and dimensioned to engage the side walls 39a, 39b of the outer region 38. In addition, the locking portion 54 is shaped such that it is offset at an angle 55 from the leading portion 52. The offset angle 55 is determined by the angle of the taper of the side wall 39b. The locking portion includes a locking surface 56 for locking engagement with the engagement surface 42 and an exterior surface 58. In this regard, the exterior surface 58 of the locking portion 54 is made to deflect as the insertable locking member 50 is inserted into the channel 30 rubbing along side wall 34 and then resiliently moving back conforming to the side wall 39b and engaging the locking surface 56 with the engagement surface 42 to secure the member 50 to the heatsink 20.

In order to prevent motion of the insertable locking member 50 in the channel 30, the insertable locking member 50 includes a stabilizing surface 60 generally shaped and dimensioned to conform to and be in touching relationship with the tapering side wall 39a.

Figure 7:
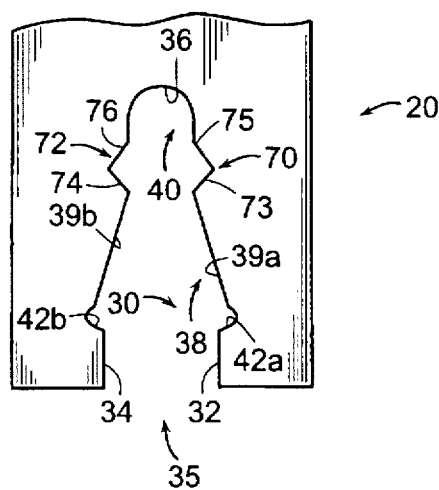
FIG. 7 is an enlarged view of the lower portion of a side elevation of the heatsink, shown in FIGS. 1–3, employing a further embodiment of the invention.

In an embodiment of the invention the preferred dimensions and angles of the channel 30 are as follows:

the channel depth measured from the external surface 21 to the bottom 36 is 0.300 inches, the width between the inner region side walls 41a and 41b is 0.74 inches and the width at the external surface 21 is 0.119 inches. The angle of the tapered side walls 39a and 39b is 180° (18 degrees)as measured from the axis of the channel (see FIG.7).

In addition, the insertable locking member 50 is 0.74 inches thick, 0.50 inches wide from one leading portion to the other, with a total length of 0.475 inches measured from the pin 82 to the leading portion 52. The combined length of the leading portion 52 and locking portion 54 is 0.195 inches and the angle 55 of the locking portion 54 is 180° (18 degrees). The pin 82 of base member 80 is 0.125 inches long as measured to the cross member 84, and the cross member 84 in 0.090 inches long. The width of the cross member 84 is 0.250 inches and the angle 86 is 45° (45 degrees).

In an alternate embodiment of the channel 30 of this invention (see FIG.7) the channel 30 includes an engagement surface 42a, 42b formed on each side wall 39a, 39b. This feature, although more complicated than the embodiment disclosed above allows for efficient and rapid securing of the two members without the necessity of determining the proper alignment required for engagement of the locking surface 56 with the engagement surface 42 when only one engagement surface 42 is formed in the channel. The embodiment also includes notch sections 70, 72 formed in the inner region 40 of the channel. The notch sections are shown as opposing tapered wall portions 73, 74, 75 & 76. Wall portions 73 and 74 taper opposite to the taper of the outer region 38 and connect to wall portions 75 and 76 at which point the taper of wall portions 75 and 76 tapers toward the bottom 36 of the channel. The intersection of the notch 70 and 72 with the outer region 38 is dimensioned such that it forms a gas tight seal between the heatsink 20 and the insertable locking member 50 when the locking member 50 is inserted into the channel 30 and securely engaged therewith.

In the mounting of the heatsink with an attached chip, the gas tight seal is important as it provides a reliable electrical connection between the insertable locking member 50 and the heatsink 20. The electrical connection of the heatsink 20 to the circuitry of the printed circuit board is needed for control of Electro-Magnetic Interference which, as is well known, could be caused by an improper connection of the heatsink assembly. The notch sections 70 and 72 insure that this connection is always made, even with worst case tolerance, as the sections allow contact between parts regardless of tolerance stackups. In addition, an oversized insertable locking member 50, in particular leading portion 52, will not distort the heatsink 20 upon insertion as the notch sections will accommodate the distortion which would otherwise be caused.

Although applicable to any number of assemblies which need to be securely engaged, the preferred embodiment of the invention is directed to the securing of heatsinks to printed circuit boards. In this regard, the insertable locking member 50 (see FIGS.4, 5 & 6) includes a base member 80 contiguous with the stabilizing surface 60. The base member 80 includes a pin 82 and a cross member 84. Furthermore, the base member 80 is rotated at an angle 86 from the longitudinal axis of the locking member 50.

Figure 8:
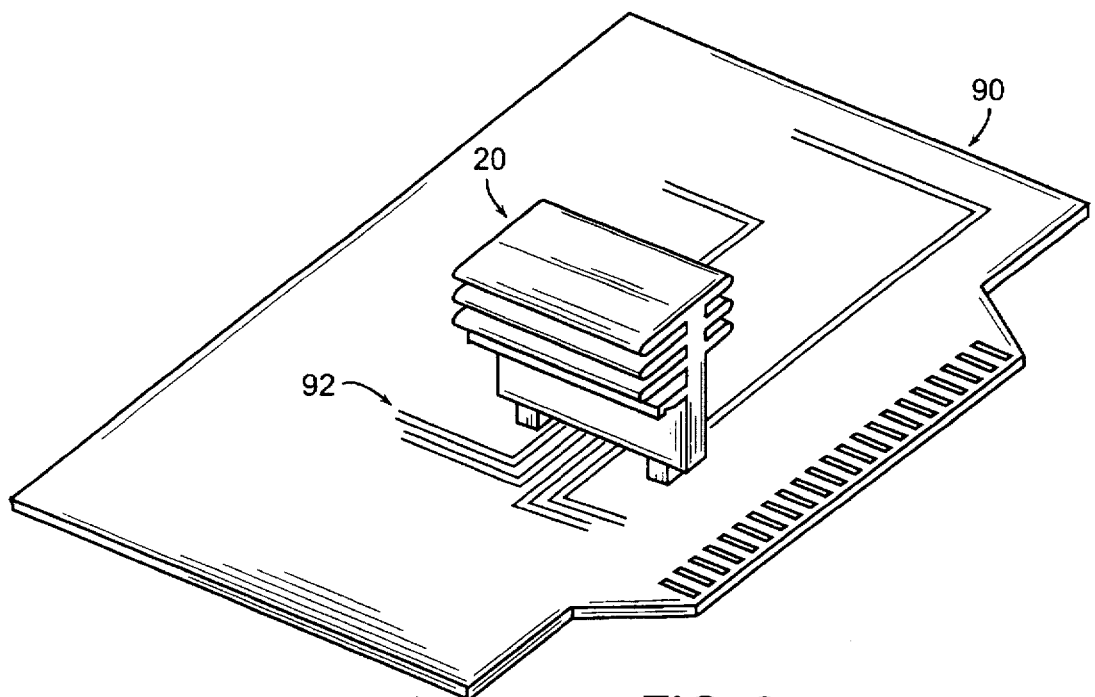
FIG. 8 is an isometric view of the computer power supply heatsink of FIG.1 mounted on a printed circuit board.

The pin 82 is shaped and dimensioned for force fit engagement with holes formed in a printed circuit board in the location designated for the heatsink. In the preferred embodiment, the pin 82 has a square shaped cross section which is pressed into the plated through holes of the printed circuit board for mounting as described herein. In addition, the upper surface 85 of the cross 84 supports the heatsink 20 whereas the bottom surface 87 is designed to sit on the printed circuit board holding the heatsink off the board by the dimension of the thickness of the cross 84 measured between the top surface 85 and the bottom surface 87. As will be appreciated by those skilled in the art and as shown in FIG.8, the invention secures the heatsink to the printed circuit board 90 and allows the heatsink 20 to sit over traces 92 on the board.

As will be appreciated by those skilled in the art, the invention permits for efficient and cost effective production of heatsinks on printed circuit boards with very little labor. In this regard, the insertable locking member 50 is inserted in the channel 30 of the heatsink 20. In general, for stability, at least two locking members 50 are normally utilized for each heatsink 20. The locking member is inserted into the channel until the locking surface 56 engages the engagement surface 42, preventing the locking member from being withdrawn from the channel. The heatsink may then be mounted on the printed circuit board 90 as appropriate. The pins 82 of the locking member 50 are pressed into undersized plated through holes in the circuit board. The force fit insertion of the pins 82 holds the heatsink assembly in place for soldering. During the soldering process, the spaces between the square pin and the round hole are filled with solder to securely attach the assembly to the printed circuit board.

What is claimed is:

1. Board mounting apparatus comprising:

a heat sink including an external bottom surface, said heat sink having a passageway extending therein from an entrance opening on the bottom surface in a direction normal thereto and terminating at an inner end within the heat sink, said passageway being defined by fixed opposing side walls and by an end wall closing the passageway at said inner end, a portion of the side walls converging to define an outer passageway region tapering towards the inner end, the passageway extending from the outer passageway region to an inner passageway region defined by generally parallel side wall portions, the converging portion of said side walls of the outer passageway region having a notch providing an engagement surface facing the inner end of the passageway; and a locking member for locking engagement with the heat sink upon insertion into the passageway thereof, said locking member including a stem with a forward end and a base end, the forward end including a longitudinal crossing member extending laterally of and normal to the stem, the crossing member dimensioned for snug fit engagement with the generally parallel portions of said side walls of the inner passageway region, an engagement member at each end of the crossing member located in spaced apart relationship with the stem and extending toward the base end thereof, the engagement members being offset from the crossing member to interlock with the engagement surface of the entrance region when the locking member is inserted in the passageway of the heat sink, the base end of the stem including a cross bar and a termination mounting pin extending beyond the cross bar to terminate the stem at the base end of the locking member, the cross bar abutting the bottom surface of the heat sink when the locking member is fully inserted in the passageway, the cross bar providing a spacer between the bottom surface of the heat sink and a mounting board when the pin is secured in a through hole of the mounting board with said cross bar engaging the board.

2. Apparatus according to claim 1 wherein the engagement surface is formed on both of the side walls of the converging portion of the outer passageway region.

3. The apparatus of claim 1, wherein said engagement member is resilient.

* * * * *